US009165918B1

(12) United States Patent
Yang et al.

(10) Patent No.: US 9,165,918 B1
(45) Date of Patent: Oct. 20, 2015

(54) COMPOSITE SEMICONDUCTOR DEVICE WITH MULTIPLE THRESHOLD VOLTAGES

(71) Applicants: Hongning Yang, Chandler, AZ (US); Xin Lin, Phoenix, AZ (US); Pete Rodriguez, Phoenix, AZ (US); Zhihong Zhang, Chandler, AZ (US); Jiang-Kai Zuo, Chandler, AZ (US)

(72) Inventors: Hongning Yang, Chandler, AZ (US); Xin Lin, Phoenix, AZ (US); Pete Rodriguez, Phoenix, AZ (US); Zhihong Zhang, Chandler, AZ (US); Jiang-Kai Zuo, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 14/272,027

(22) Filed: May 7, 2014

(51) Int. Cl.
| | |
|---|---|
| *H01L 29/66* | (2006.01) |
| *H01L 27/02* | (2006.01) |
| *H01L 29/78* | (2006.01) |
| *H01L 29/08* | (2006.01) |
| *H01L 29/10* | (2006.01) |
| *H01L 27/088* | (2006.01) |
| *H01L 21/8234* | (2006.01) |
| *H01L 21/265* | (2006.01) |

(52) U.S. Cl.
CPC ...... *H01L 27/0248* (2013.01); *H01L 21/26513* (2013.01); *H01L 21/823412* (2013.01); *H01L 21/823418* (2013.01); *H01L 27/088* (2013.01); *H01L 29/0865* (2013.01); *H01L 29/0882* (2013.01); *H01L 29/1045* (2013.01); *H01L 29/1079* (2013.01); *H01L 29/1095* (2013.01); *H01L 29/66575* (2013.01); *H01L 29/66681* (2013.01); *H01L 29/7816* (2013.01); *H01L 29/7835* (2013.01)

(58) Field of Classification Search
CPC ................ H01L 27/088; H01L 27/105; H01L 21/26586; H01L 21/77; H01L 21/823412; H01L 29/66681; H01L 29/7816
USPC .......... 257/343, 341, 335, 336; 438/174, 217, 438/525
See application file for complete search history.

(56) References Cited

U.S. PATENT DOCUMENTS

| | | | | |
|---|---|---|---|---|
| 6,566,204 | B1 * | 5/2003 | Wang et al. | 438/286 |
| 6,818,951 | B2 * | 11/2004 | Moller et al. | 257/341 |
| 7,851,889 | B2 | 12/2010 | Zhu et al. | |
| 2002/0074612 | A1 * | 6/2002 | Bulucea et al. | 257/402 |
| 2005/0237797 | A1 * | 10/2005 | Jeng | 365/185.01 |
| 2012/0168840 | A1 * | 7/2012 | Willemsen | 257/296 |

OTHER PUBLICATIONS

Khemka et al., "Detection and Optimization of Temperature Distribution Across Large-Area Power MOSFETs to Improve Energy Capability", IEEE Transactions on Electron Devices, Jun. 2004, pp. 1025-1032, vol. 51, No. 6.

* cited by examiner

*Primary Examiner* — Tu-tu Ho
(74) *Attorney, Agent, or Firm* — Lempia Summerfield Katz LLC (57) ABSTRACT

A device includes a semiconductor substrate, a first constituent transistor including a first plurality of transistor structures in the semiconductor substrate connected in parallel with one another, and a second constituent transistor including a second plurality of transistor structures in the semiconductor substrate connected in parallel with one another. The first and second constituent transistors are disposed laterally adjacent to one another and connected in parallel with one another. Each transistor structure of the first plurality of transistor structures includes a non-uniform channel such that the first constituent transistor has a higher threshold voltage level than the second constituent transistor.

20 Claims, 4 Drawing Sheets

COMPOSITE SEMICONDUCTOR DEVICE WITH MULTIPLE THRESHOLD VOLTAGES

FIELD OF INVENTION

The present embodiments relate to semiconductor devices and, more specifically, power and other semiconductor devices having transistor structure arrangements.

BACKGROUND

Integrated circuits (ICs) and other electronic devices often include arrangements of interconnected field effect transistors (FETs), also called metal-oxide-semiconductor field effect transistors (MOSFETs), or simply MOS transistors or devices. A typical MOS transistor includes a gate electrode as a control electrode, and spaced apart source and drain electrodes. A control voltage applied to the gate electrode controls the flow of current through a controllable conductive channel between the source and drain electrodes.

Power transistor devices are designed to be tolerant of the high currents and voltages that are present in power applications such as motion control, air bag deployment, and automotive fuel injector drivers. One type of power MOS transistor device is a laterally diffused metal-oxide-semiconductor (LDMOS) transistor device. In an LDMOS device, a drift space is provided between the channel region and the drain region.

LDMOS devices are often characterized by a "safe operating area" in which the operating current and voltage levels are below levels that would result in device destruction or other damage. The electrical safe operating area of a device relates to the generation of secondary charge carriers through impact ionization. In an n-channel LDMOS device, electrons may generate additional electron-hole pairs via impact ionization after being accelerated in a region having a high electric field, such as near the drain boundary. If a sufficient number of holes—the secondary charge carriers—are created to raise the potential of the body of the LDMOS device to an extent that the junction with the source is forward biased, the resulting injection of the holes across the junction can activate a parasitic npn bipolar transistor formed via the source (emitter), body (base), and drain (collector) regions of the LDMOS device. Very large, damaging currents can occur via the activation of the parasitic bipolar transistor, an operating condition referred to as "snapback."

Damage may also occur in LDMOS devices when operated outside of a thermal safe operating area of the device. The thermal safe operating area specifies the voltage and current levels in which the device may operate without damage arising from excessive heat. In some cases, the energy handling capability of a device leads to a thermal operating area more restrictive than the electrical safe operating area.

Attempts to remain within both the electrical safe operating area and the thermal safe operating area are often undesirably limiting factors for device operation and application. For example, applications in which a large LDMOS device is connected to an inductive load may involve switching transients that drain large amounts of energy from the inductive load to the LDMOS device. LDMOS devices may thus experience thermal and/or electrical failure during switching.

BRIEF DESCRIPTION OF THE DRAWINGS

The components and the figures are not necessarily to scale, emphasis instead being placed upon illustrating the principles of the various embodiments. Moreover, in the figures, like reference numerals designate corresponding parts throughout the different views.

DETAILED DESCRIPTION OF THE PRESENTLY PREFERRED EMBODIMENTS

Embodiments of composite laterally diffused metal oxide semiconductor (LDMOS) and other semiconductor devices and electronic apparatus are described, along with methods of fabricating such devices and apparatus. The composite devices include a number of constituent devices arranged in a manner to reduce the likelihood of thermal failure. The constituent devices are arranged in accordance with the recognition that thermal failure often occurs at or near the center of a power transistor device, such as an LDMOS transistor device. The temperatures reached at the center of a power transistor device may be higher than at or near the periphery of the device. Heat generated at the periphery may be closer to a heat sink, such as the edge of the device. In contrast, heat sinks may not be available or sufficiently near the device center to remove the heat generated in the interior of the device.

The disclosed embodiments may be useful in connection with LDMOS and other devices having a large or very large area in which excessive heat may be generated through self heating. For example, such self heating may occur in an LDMOS device when high current and large drain voltages are present. Energy absorbed during a short period of time may otherwise cause a dramatic rise in temperature and lead to fatal destruction of the device.

In most cases, the heat at device center is transferred through a temperature gradient from center to edge where the heat is removed from a nearby sink. As the gradient increases, the thermal energy is transferred faster. A balance may thus be reached between the heat generation and the heat dispassion when the temperature gradient rises to a certain level. The balance implies that the center portion of a large device (e.g., a large LDMOS device) may be very hot relative to the periphery of the device. The device center may thus be the weakest part, or the part that undergoes thermal destruction.

The arrangement or layout of the constituent transistors of the composite devices is configured to improve the thermal safe operating area (SOA) of the device. In two-transistor (2T) embodiments, one of the transistors may be disposed at the center of the composite device and has a high (or higher) threshold voltage (Vt). The other one of the transistors may be disposed along the periphery of the device and has a low (or lower) threshold voltage. Some embodiments may thus include a peripheral or outer device that surrounds a central or inner device with a higher threshold voltage than the peripheral device. The low threshold voltage may correspond with a baseline threshold voltage for power transistor structures of the composite device. For given gate and drain voltages, the high-Vt device yields relatively lower current, producing lower power in the device interior, while the baseline transistor structure may generate higher current because of the lower threshold voltage, thereby producing higher power in the periphery. The 2T composite structure may effectively lower the center temperature of the device and thereby increase the energy capability of the device. The devices of the disclosed embodiments may thus be capable of surviving higher energy stress. With the 2T composite arrangement, the disclosed embodiments may achieve an improved thermal SOA while avoiding other efforts directed to trying to flatten the temperature distribution within the device through, for instance, reducing the input power at the center of the device.

The higher threshold voltage of the central device may be established through a halo dopant implantation. The halo dopant implantation may be used in a process flow directed to forming logic transistor or other semiconductor devices of the electronic apparatus. The threshold voltage may be further adjusted through the selective formation of a source extension region, such as a lightly doped drain (LDD) region adjacent the source region. For instance, the low-Vt constituent transistor may include source extension regions, while the high-Vt constituent transistor may lack source extension regions. The selective presence of source extension regions may enhance the difference in the respective threshold voltages of the constituent devices.

The use of a halo or other implant to establish the higher threshold voltage allows the inner and outer constituent devices to be configured otherwise (or nearly) identically. For instance, the transistor structures of the inner and outer devices may have a common footprint. The common footprint allows a smooth transition at a boundary between the two constituent devices. The similar configuration of the constituent devices also leads to the lack of an isolation region between the constituent devices. For instance, with the common footprint, there is no need to provide an isolation gap (e.g., a deep trench isolation (DTI) or other isolation region) between the constituent devices. Without an isolation gap, degradation in breakdown voltage level (e.g., BVdss) does not occur. These and other layout complications may be avoided.

The operational and other characteristics of the constituent devices may be similar with the exception of, and despite, the difference in threshold voltages. For example, the presence (or absence) of the halo implant does not significantly impact the on-resistance levels (Rdson) of the constituent devices. With no significant increase in the overall on-resistance of the composite device, there is no need to enlarge the area of the composite device. For these and other reasons, the disclosed embodiments may provide a robust semiconductor device well suited for inductive loads and other applications involving higher energy capabilities.

The inner and outer constituent devices may be configured as power transistor devices. Each power transistor device may include a plurality of transistor structures disposed in a periodically repeating source-gate-drain arrangement. In that arrangement, adjacent transistor structures may share either a common source or a common drain.

Although described below in connection with n-channel LDMOS transistors, the disclosed devices are not limited to any particular transistor configuration. For instance, application of the features of the disclosed devices is not limited to LDMOS or other power MOS devices. One or more features of the disclosed devices may be applied to other devices and/or device configurations. For example, the disclosed devices may have varying RESURF structures, including single, double, or other RESURF structural arrangements, each of which may be referred to herein as a "RESURF transistor."

For convenience of description and without any intended limitation, n-channel LDMOS devices are described and illustrated herein. However, the disclosed devices are not limited to re-channel devices, as p-channel and other types of devices may be provided by, for example, substitution of semiconductor substrate and/or regions of opposite conductivity type. Thus, for example, each semiconductor region, layer or other structure in the examples described below may have a conductivity type (e.g., n-type or p-type) opposite to the type identified in the examples below.

Although described in connection with inductive loads, the semiconductor devices described herein are not limited to any particular type of load, circuit, or other application or electronic apparatus. The semiconductor devices may be useful in connection with a wide variety of contexts. The semiconductor devices are not limited to use as a discrete device, and may be incorporated into a wide variety of integrated circuits.

Figure 1:
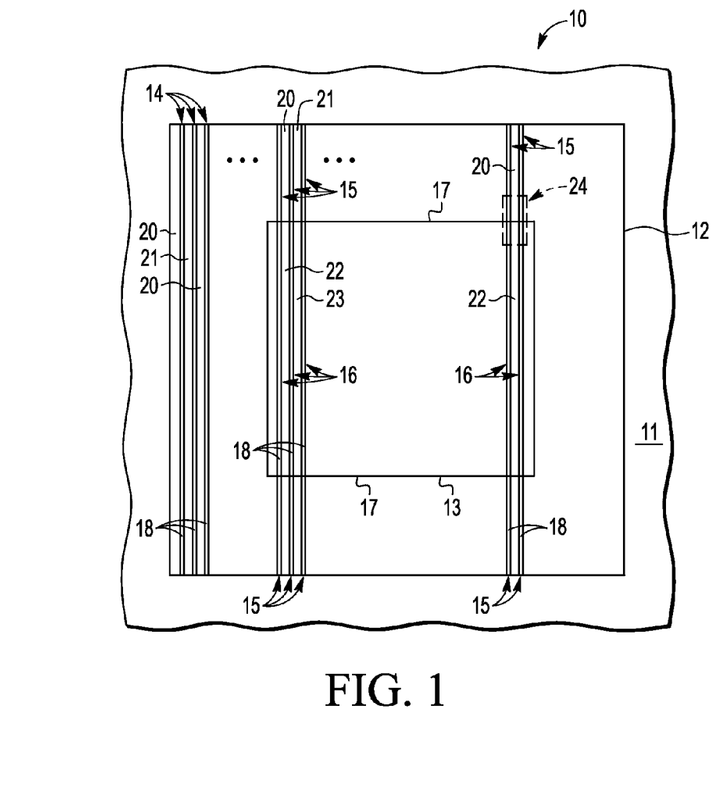
FIG. 1 is a schematic, plan view of an exemplary composite LDMOS transistor device having constituent transistor devices with different threshold voltages in accordance with one embodiment.

FIG. 1 is a schematic plan view of an example of a composite LDMOS transistor device 10 constructed in accordance with one embodiment. The device 10 includes a semiconductor substrate 11 in which a number of constituent transistor devices are formed. The constituent transistor devices are connected in parallel with one another to establish the composite LDMOS transistor device 10. The parallel connection of the constituent transistor devices may involve a number of shared terminals, including, for instance, a shared source terminal, a shared drain terminal, and a shared gate terminal. In this example, the device 10 includes a pair of constituent transistor devices, and may thus be considered a two-transistor, or 2T, composite device. The constituent transistor devices include a peripheral or outer constituent transistor 12 and a central or inner constituent transistor 13. The constituent transistors 12, 13 are disposed laterally adjacent one another. In this example, the constituent transistors 12, 13 are contiguous with one another. Additional or alternative constituent transistor devices may be provided.

The peripheral constituent transistor 12 includes an array of transistor structures 14, 15 in the semiconductor substrate connected in parallel with one another. Each transistor structure 14, 15 is elongated in a respective one of a plurality of parallel rows (or columns) oriented in a first lateral direction or dimension of the device 10. For ease in description, the first lateral dimension is referred to herein as the length of the device 10. Each transistor structure 14 extends laterally across the full length of the device 10. In contrast, each transistor structure 15 does not extend across the full length of the device 10, but rather extends only across a portion of the length of the device 10 on one of two opposing sides of the central constituent transistor 13. Adjacent transistor structures 14, 15 in the array are disposed alongside and spaced from one another in a second lateral direction or dimension orthogonal to the length direction (i.e., the width direction).

Any number of transistor structures 14, 15 may be provided. For example, the device 10 may include about two hundred or more transistor structures.

The central constituent transistor 13 includes an array of transistor structures 16 disposed in the semiconductor substrate 11 and connected in parallel with one another. Each transistor structure 16 extends laterally across the full length of the central constituent transistor 13. Each transistor structure 16 abuts, or is otherwise lengthwise adjacent to, a respective pair of the transistor structures 15 at a boundary 17 between the constituent transistors 12, 13. In this example, each transistor structure 16 is contiguous with a respective pair of the transistor structures 15 at the boundary 17, with each transistor structure 15 disposed at a respective end of the transistor structure 16. The abutting transistor structures of the constituent transistors 12, 13 are contiguous with one another in the direction (e.g., the length direction) orthogonal to the lateral direction in which channels and/or conduction paths of each transistor structure 14, 15, 16 are oriented. Examples of the conduction paths of the transistor structures 14, 15, 16 are shown and described in connection with FIGS. 3-5.

The transistor structures 14, 15 of the constituent transistor 12 may surround the transistor structures 16 of the constituent transistor 13. In the embodiment of FIG. 1, the transistor structures 16 of the constituent transistor 13 are centered within the transistor structures 14, 15 of the constituent transistor 12. Other arrangements may be used, an example of which is shown and described in connection with FIG. 6.

Abutting transistor structures 15, 16 are aligned with one another. The alignment of the adjacent transistor structures 15, 16 allows common gate structures to be shared by the adjacent transistor structures 15, 16. In the LDMOS example of FIG. 1, each transistor structure 14, 15, 16 includes a gate 18 supported by the semiconductor substrate 11. Each gate 18 extends the entire length of the device 10. Abutting transistor structures 15, 16 may thus share a respective one of the gates 18. In this example, the device 10 has a uniform gate pitch. The gate pitch may vary in other cases.

The transistor structures 14, 15, 16 disposed in adjacent rows (or columns), e.g., structures adjacent in the width direction, may share one or more regions or components. The shared regions or components may be disposed on a source side 20 or a drain side 21 of the transistor structures 14, 15, or on a source side 22 or a drain side 23 of the transistor structures 16. For example, a pair of adjacent transistor structures 14 may share a common source region and a common body region on the source side 20 of the transistor structures 14. Other adjacent transistor structures 14 may share a common drain region and a common drift region on the drain side 21 of the transistor structures 14. In the example of FIG. 1, adjacent transistor structures 14 share components on either the source side 20 or the drain side 21, alternating therebetween. Adjacent transistor structures 15 may be similarly configured and arranged. Adjacent transistor structures 16 may also be similarly configured and arranged in alternating fashion along the source and drain sides 22, 23.

A portion 24 of the device 20 is referenced in FIG. 1 to highlight the boundary 17 between the transistors 12, 13. The layout of the device 20 in the portion 24 is schematically shown in greater detail in FIG. 2.

Figure 2:
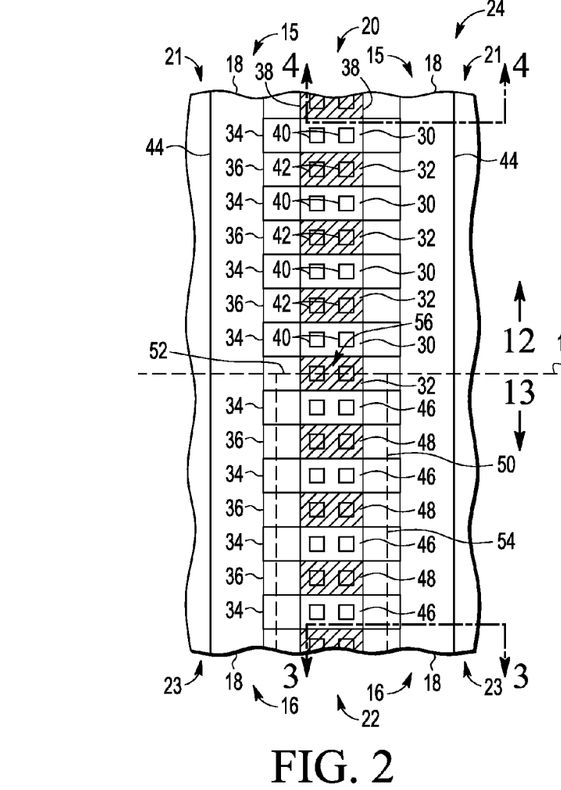
FIG. 2 is a partial, schematic, plan view of the composite LDMOS transistor device of FIG. 1 to depict respective source-side layouts of the constituent transistor devices.

FIG. 2 depicts a pair of adjacent transistor structures 15 of the constituent transistor 12 and a pair of adjacent transistor structures 16 of the constituent transistor 13. Each one of the transistor structures 15 is contiguous and aligned with a respective one of the transistor structures 16 along the boundary 17. The aligned transistor structures 15, 16 abut one another end-to-end. The aligned transistor structures 15, 16 share one of the gates 18. The gates 18 thus extend across the boundary 17. Each gate 18 is shared by a respective one of the transistor structures 15 and a respective one of the transistor structures 16.

The source sides 20 of the transistor structures 15 include source regions 30 and body contact regions 32 disposed in a laterally alternating arrangement. In this example, the source and body contact regions 30, 32 alternate laterally along the length direction. The source regions 30 and the body contact regions 32 are shared by the pair of adjacent transistor structures 15. The source regions 30 are formed by implantation of dopant (e.g., n-type dopant) through openings 34 configured via photolithography. The body contact regions 32 are formed by implantation of dopant (e.g., p-type dopant) through openings 36 configured via photolithography. The openings 34, 36 overlap the gates 18 such the source and body contact regions 30, 32 are self-aligned with edges 38 of the gates 18. The source and body contact regions 30, 32 are disposed within a body region (FIG. 4) shared by the transistor structures 15.

The source sides 20 of the transistor structures 15 include Ohmic contacts 40 and 42 for the source regions 30 and the body contact regions 32, respectively. In this example, two Ohmic contacts 40, 42 are provided for each source region 30 and each body contact region 32, respectively. Each Ohmic contact 40, 42 may include one or more metal layers supported by the semiconductor substrate 11 (FIG. 1). The Ohmic contacts 40, 42 may extend upward from a surface of the semiconductor substrate 11 to a metal layer in which an interconnect (not shown) is formed. The interconnect may run the length of the transistor structures 15 to electrically connect each of the source and body contact regions 30, 32. With that electrical connection, the source regions 30 may be considered constituent source regions of a collective source region for the transistor structure 15. The respective interconnects of the transistor structures 15 may then be electrically connected to one another (e.g., via one or more further interconnects) to connect the transistor structures 15 in parallel, thereby forming the constituent transistor 12.

The drain sides 21 of the pair of transistor structures 15 are disposed along an edge 44 of each gate 18. Examples of the regions or components of the drain sides 21 are shown in connection with the embodiments of FIGS. 3 and 4.

The transistor structures 16 of the constituent transistor 13 are similar to the transistor structures 15 of the constituent transistor 12 in a number of ways. A number of regions, components, or other features of the transistor structures 16 are shared or otherwise configured similarly to the corresponding features of the pair of transistor structures 15. For example, the gates 18 are shared and thus identically configured on each side of the boundary 17. Other identically or similarly configured features include Ohmic contacts 40, 42, which are not labeled in the transistor structures 16 for ease in illustration. The interconnects and/or other structures used for connectivity and passivation may also be shared and, thus, identically configured.

The source sides 22 of the pair of transistor structures 16 include alternating source regions 46 and body contact regions 48. The source regions 46 and the body contact regions 48 may be configured similarly to the corresponding regions of the transistor devices 15. One possible exception may involve the presence (or absence) of an extension region for each source region 46 that extends laterally under a sidewall spacer (FIGS. 3-5) of the gate 18. As in the transistor structures 15, the source and body contact regions 46, 48 alternate laterally along the length direction and are shared by the pair of adjacent transistor structures 16. The source regions 46 and the body contact regions 48 may be formed by the same dopant implantation procedures and similar photolithography openings 34, 36 used to form the corresponding regions of the transistor structures 15. The openings 34, 36 for the transistor structures 15, 16 are thus labeled with common reference numerals.

The transistor structures 16 differ from the transistor structures 15 in a body region (FIG. 3) in which the source regions 46 and the body contact regions 48 are disposed. The body region is additionally doped along the source side 22 of the transistor structures 16. In this example, the source side 22 includes a halo region 50. The halo region 50 is not present in the body region of the transistor structures 15. A lateral edge 52 of the halo region 50 is disposed at, and, in fact, defines the boundary 17 between the constituent transistors 12, 13.

The halo region 50 is formed via a dopant implantation procedure during which the dopant ions (e.g., p-type dopant ions) pass through an opening 54 defined photolithographically. The implantation procedure is configured as an angled implant such that the halo region 50 extends laterally from the source region 46 under the gates 18. The lateral extent of the halo region 50 under the gates 18 establishes a non-uniform channel for the transistor structures 16. The dopant ions (e.g., p-type dopant ions) in the halo region 50 increase the dopant concentration level of the body region in a portion of the channel region. The increased dopant concentration level, in turn, establishes a higher threshold voltage for the transistor structures 16 relative to the threshold voltage of the transistor structures 15, which may be otherwise configured similarly thereto. Further details regarding the halo region 50 are provided in connection with the exemplary embodiment shown in FIG. 3.

The opening 54 overlaps the gates 18. The extent of the overlap may vary from the overlap used for the source and body contact region openings 34, 36. In this example, the opening 54 does not extend as far laterally outward as the source and body contact region openings 34, 36. In the embodiment of FIG. 2, the opening 54 corresponds with the lateral boundary of the halo region 50 for ease in illustration. The lateral boundary of the halo region 50 may differ from the location of the opening 54, and depend on a number of factors, including, for instance, the angle of the implantation procedure. In one example, the angle falls in a range from about 35 degrees to about 55 degrees.

The boundary 17 between the adjacent transistor structures 15, 16 is disposed in one of the body contact regions 32. The lateral edge 52 of the halo region 50 is located within an interior area 56 of one of the body contact regions 32. The lateral edge 52 may bisect or otherwise pass through the interior area 56. In this example, the lateral edge 52 is disposed under the contacts 42 for the body contact region 32. The location of the lateral edge 52 avoids disturbing one of the source regions 30, 46 and the corresponding channels or current flow paths adjacent thereto. A smooth transition between the constituent transistor devices 12, 13 may accordingly be achieved. The body contact region 32 through which the lateral edge 52 passes may be otherwise configured identically or similarly to the other body contact regions 32 of the transistor structure 15 and the body contact regions 48 of the transistor structure 16. The partial presence of the halo region 50 in the body contact region 32 through which the lateral edge 52 passes has no effect on a channel.

The drain sides 23 of the transistor structures 16 may be identical or similar to the drain sides 21 of the transistor structures 15. For instance, the drain sides 23 are also disposed along the edge 44 of each gate 18. In the embodiment of FIG. 2, the regions, components, and other features of the transistor structures 15, 16 along the drain sides 21, 23 may be configured identically or similarly. Further details regarding the features of the drain sides 21, 23 are provided below in connection with the exemplary embodiments of FIGS. 3-5.

FIG. 2 shows how the transistor structures 15, 16 are not electrically isolated from one another. The lack or absence of an isolation region between the transistor structures 15, 16. Each transistor structure 15 abuts one of the transistor structures 16 without any intervening isolation region, such as a doped isolation ring or a DTI region.

While FIG. 2 addresses the transition in the source side configuration between the abutting transistor structures 15, 16, the source side configuration also changes at or near the other sides of the boundary 17. The source side configuration also changes at the two sides of the boundary 17 that run parallel to the length of the transistor structures 15, 16. In the embodiment of FIG. 1, the boundary 17 along those sides may mark the location of the gate 18 of the last transistor structure 16 to have a source side configured with a halo region.

Figure 3:
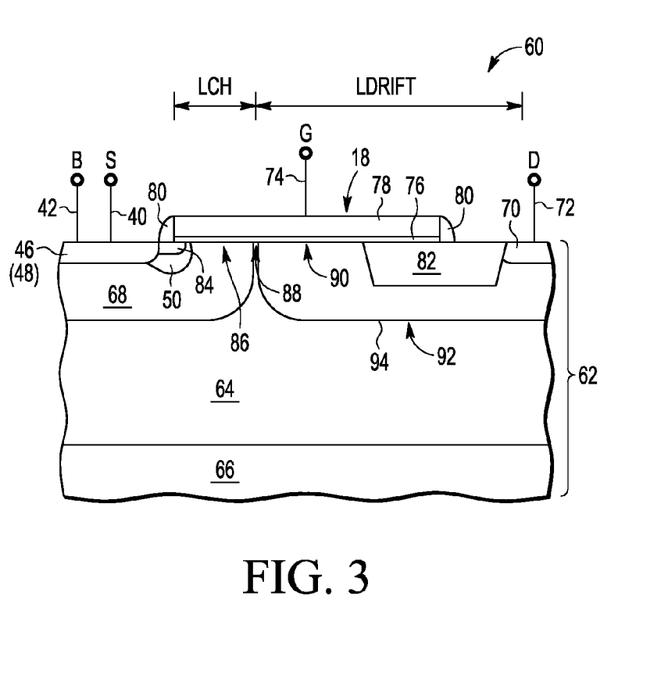
FIG. 3 is a partial, cross-sectional, schematic view of an exemplary transistor structure of one of the constituent transistor devices of FIGS. 1 and 2 taken along lines 3-3 of FIG. 2 and having a non-uniform channel and a higher threshold voltage in accordance with one embodiment.

FIG. 3 is a schematic cross-sectional view of an example of a transistor structure 60 of the constituent transistor 13 (FIGS. 1 and 2) taken along lines 3-3 of FIG. 2. The transistor structure 60 may be of one of the transistor structures 16 (FIGS. 1 and 2). In one embodiment, the transistor structure 60 is configured as an n-channel LDMOS transistor. The transistor structure 60 may be configured as a RESURF transistor structure. The transistor structure 60 is disposed in (and/or on) a semiconductor substrate 62 (e.g., the substrate 11 of FIG. 1), which may, in turn, include a number of epitaxial layers 64. In this example, the semiconductor substrate 62 includes a single p-type epitaxial layer 64 grown on an original or support substrate 66. The original substrate 66 may be a heavily doped p-type substrate. In other cases, the original substrate 66 may be lightly doped. The transistor structure 60 may alternatively or additionally include non-epitaxial layers in which one or more transistor regions are formed. Any one or more of the layers of the semiconductor substrate 62 may include silicon.

The structural, material, and other characteristics of the semiconductor substrate 62 may vary from the example shown. For example, the semiconductor substrate 62 may have a silicon-on-insulator (SOI) construction in which one or more buried insulator layers are disposed between the epitaxial layer 64 and the original substrate 66. The insulator layer may include silicon oxide. Additional, fewer, or alternative layers may be included in the semiconductor substrate 62. Any number of additional semiconductor and/or non-semiconductor layers may be included. For example, a buried doped layer may be disposed between the epitaxial layer 64 and the original substrate 66. The buried doped layer may be doped before the growth of the epitaxial layer 64. In some cases, the doped buried layer may assist in drift region depletion to support the RESURF effect. The disclosed devices are thus not limited to, for instance, substrates including epitaxially grown layers, or SOI substrates, and instead may be supported by a wide variety of other types of semiconductor substrates, including bulk substrates.

The transistor structure 60 is not individually isolated from adjacent transistor structures of the transistor device 10 (FIG. 1). Buried insulator or other layers may act as a lower or bottom boundary that electrically isolates the transistor structure 60 from the original substrate 66. But such layers do not isolate the transistor structure 60 from the other transistor structures of the transistor device 10. The transistor structure 60 does not include peripheral or other device isolation layers or regions in the semiconductor substrate 62 dedicated solely to laterally separating the transistor structure 60 from adjacent transistor structures. Any device isolation layer(s) or region(s), such as isolation wells or trench regions (e.g., DTI regions), may instead laterally and/or otherwise surround the outer periphery of the entire composite device 10 (FIG. 1). These layers or regions may be provided to act as a barrier that electrically isolates or separates the entire transistor device 10 (FIG. 1) from the rest of the substrate 62. In contrast, neither the constituent transistor devices 12, 13 (FIGS. 1 and 2) nor the individual transistor structures thereof are electrically isolated from one another.

The transistor structure 60 includes a device body or body region 68 in the semiconductor substrate 62. In this example, the body region 68 is a p-type well formed in the epitaxial layer 64 of the substrate 62. The p-type well may be configured for high voltage operation (e.g., high side operation). The body region 68 may be biased via one or more heavily doped p-type body contact regions 48 and corresponding electrodes or terminals (e.g., the Ohmic contact 42) formed in or otherwise above the p-type well of the body region 68 in the semiconductor substrate 62. The dopant concentration of each contact region 48 may be at a level sufficient to establish an Ohmic contact to the body region 68.

The transistor structure 60 includes heavily doped source and drain regions 46 and 70 in the semiconductor substrate 62. In the example of FIG. 3, the source and drain regions 46 and 70 are n-type doped portions of the epitaxial layer 64. The heavily doped n-type source region 46 is disposed within, on, and/or otherwise above the body region 68. The source and drain regions 46, 70, or a portion thereof, may have a dopant concentration at a level sufficient to establish Ohmic contacts with source and drain electrodes or terminals (e.g., Ohmic contacts 40, 72) for biasing the source and drain regions 46, 70, respectively.

The source and drain regions 46 and 70 are laterally spaced from one another in the lateral dimension shown in the cross-section of FIG. 3 (e.g., the width direction referenced above). Such spacing defines a conduction path of the transistor structure 60 between the source and drain regions 46 and 70. The conduction path may thus be oriented along the lateral dimension shown in FIG. 3. In some embodiments, the source and drain regions 46 and 70 may have additional or alternative lateral spacing. In this example, the transistor structure 60 shares the source region 46 with an adjacent transistor structure on one side, and shares the drain region 70 with another transistor structure adjacent the other side. Any number of source or drain regions may be provided. Other source/drain arrangements may be used. For example, the drain region 70 may not be shared or otherwise disposed between adjacent transistor structures.

The transistor structure 60 includes one of the gates 18 shared with abutting transistor structures, as described above. The gate 18 may be a composite structure formed on or above the surface of the semiconductor substrate 62. The gate 18 is disposed between the source region 46 and the drain region 70. Other gate arrangements may be used. For example, the gate structure 18 may surround the drain region 70. The gate 18 may be biased via a gate terminal or other conductive interconnect 74 to control movement of charge carriers between the source and drain regions 46, 70 during operation. The gate 18 includes a gate dielectric 76, a conductive layer 78 on or over the gate dielectric 76, and sidewall spacers 80 along sidewalls of the gate dielectric 76 and the conductive layer 78. The gate dielectric 76 may include silicon dioxide (or oxide) deposited or otherwise formed on the surface of the semiconductor substrate 62. The conductive layer 78 may include a polysilicon plate. The gate dielectric 76 insulates the conductive layer 78 from the substrate 62. The sidewall spacers 80 may include a dielectric material disposed along lateral edges of the gate structure. The sidewall spacers 80 may cover the lateral edges to act as a silicide blocker to prevent a silicide short along the surface of the semiconductor substrate 62. The sidewall spacers 80 may provide spacing to separate the conductive components of the gate 18 from the source region 46 and other regions of the transistor structure 60. In this example, one of the sidewall spacers 80 is used for alignment purposes in defining an edge of the source region 46.

The configuration of the gate 18 may vary. For example, the gate 18 may include multiple conductive layers (e.g., polysilicon plates). The components, materials, and other characteristics of the gate 18 may thus vary from the example shown.

A number of STI regions may be formed at the surface of the semiconductor substrate 62. In this embodiment, a single STI region 82 spaces the gate structure 18 from the high voltage applied to the drain region 70. The STI region 82 may be configured to prevent or minimize hot carrier injection (HCI) into the gate dielectric 76 of the gate 18. With the STI region 82, the transistor structure 60 may be configured as a field drift LDMOS transistor device. The field oxide (or other dielectric) may be provided via other structures in other embodiments. In alternative embodiments, the transistor structure 60 is configured as an active drift device.

In some embodiments, no further STI regions are disposed in the semiconductor substrate 62 within the device area of the device 10 (FIG. 1) beyond the STI regions 82 positioned to space gates 18 from respective drain regions 70. STI regions are not used to isolate or separate the transistor structure 60 from adjacent transistor structures, or to separate respective regions (e.g., the source and body contact regions 46, 48) of the transistor structure 60, from one another. Alternatively, one or more STI regions may be used to separate contact regions, Ohmic contacts, or other structures disposed at, or supported by, the surface of the semiconductor substrate 62.

The transistor structure 60 may be configured with one or more lightly or intermediately doped transition or extension regions (e.g., n-type lightly doped drain, or NLDD, regions) at or near the source and drain regions 46 and 70. In the example of FIG. 3, an extension region 84 is disposed adjacent the source region 46. The extension region 84 may be or include a diffused region formed in connection with the source region 46. The extension region 84 extends laterally under the gate 18. The extension or transition regions may assist in controlling the electric field at or near the surface, including in areas other than those areas near the source region 46 or the drain region 70.

When the gate 18 is biased, charge carriers (in this case, electrons; alternatively, holes) accumulate in one or more channel areas or regions 86. Each channel region 86 (or a portion thereof) may be located in the body region 68 under the gate 18. In this example, the accumulation of holes results in a charge inversion in the channel region 86 from the p-type body region 68 to an n-type conduction layer or area near the surface of the semiconductor substrate 62. Once a sufficient amount of the charge carriers accumulate in the conduction layer or area, charge carriers are capable of flowing from the source region 46 toward the drain region 70 through the channel region 86 of the body region 68, a distance Lch indicated in FIG. 3.

The channel region 86 may include other regions or areas in the semiconductor substrate 62 in which charge inversion or accumulation occurs as a result of the bias applied to the gate 18. Charge carriers may also accumulate outside of or beyond the body region 68. In the example of FIG. 3, charge carriers may also accumulate in a portion 88 of the epitaxial layer 64 adjacent the body region 68. The portion 88 may, in some cases, be considered to be part of an accumulation region 90 of the device 20. The accumulation region 90 is a portion of a drift region 92 of the transistor structure 60 disposed under the gate 18 at or near the substrate surface. Charge carriers accumulate in the accumulation region 90 upon application of the gate bias voltage. The channel region 86 and the accumulation region 90 may form part of a conduction region or path of the transistor structure 60.

The conduction path is not limited to regions in which charge inversion or accumulation occurs or to regions in which conduction is enabled or enhanced via the bias voltage applied to the gate 18. The conduction path or regions are thus not limited to regions at or near the substrate surface. For example, the conduction path includes other portions of the drift region 92 through which charge carriers drift to reach the drain region 70. The drift region 92 may electrically couple the drain region 70 and the channel region 86. In this example, the drift region 92 is formed with, and/or includes, an n-type well 94 under the STI region 82. As described below, the drift region 92 may be defined through a dopant implantation to form the n-type well 94 and a subsequent thermal anneal (or other fabrication process) during which heating leads to dopant diffusion that distributes the dopant under the drain region 70.

The drift region 92 (and/or the n-type well 94) may laterally extend under the gate 18 to form the accumulation region 90 of the device 20. The p-type well 94 and/or the drift region 92 may be adjacent to (e.g., line-on-line or contiguous with), and/or spaced from, the body region 68. During operation, charge carriers accumulate in the accumulation region 90 before drifting through across a distance Ldrift of the drift region 92 (and/or the n-type well 94).

The conduction path along which the charge carriers flow from the source region 46 to the drain region 70 passes through, or includes, the drift region 92. The conduction path of the transistor structure 60 may thus include additional or alternative areas or regions having a different conductivity type than the body region 68. The drift region 92 may be configured to allow the charge carriers to drift under the electric field established by the drain-source voltage applied between the drain region 70 and the source region 46. The drift region 92 thus electrically couples the drain region 70 to the channel region 86 and the source region 46 during operation.

In the embodiment of FIG. 3, the drift region 92 is configured as a field drift region. The STI region 82 is disposed between the accumulation region 90 and the drain region 70. Alternative or additional field isolation structures may be disposed between the accumulation region 90 and the drain region 70. For example, the field isolation structures may include one or more field plates disposed above the substrate surface.

The conduction path or regions of the transistor structure 60 may include still other regions, whether n-type or p-type, at or near the substrate surface. For example, the channel region 86 and/or other conduction region of the transistor structure 60 may include one or more intermediately doped n-type transition regions in addition to the extension region 84.

The drift region 92 may be configured for depletion during operation to reduce the magnitude of the electric field in accordance with the reduced surface field (RESURF) effect. The depletion of the drift region 78 may lead to improved breakdown performance. In this example, a junction forms between the n-type well 94 and the p-type epitaxial layer 64 and/or the body region 68 to establish a RESURF effect directed to decreasing the electric field in areas in and/or around the drift region 92. A decreased electric field may avoid breakdown along the conduction path, and thereby increase the intrinsic breakdown voltage (BVdss) of the transistor structure 60. The drift region 92 may be further configured to achieve both a high breakdown voltage level and a low drain-source resistance (Rdson) by leveling the electric field in certain locations within the drift region 92. The drift region 92 may be depleted both laterally and vertically, at least in part, during operation along reverse-biased PN junctions with, for instance, the epitaxial layer 64 and/or the body region 68. The junctions are reverse biased as a result of the application of the drain voltage Vds between the source region 46 and the drain region 70. The reverse-biased junctions may reduce the electric field, as in the RESURF effect, for improved breakdown performance. In an alternative embodiment, the transistor structure 60 may be configured to establish a double RESURF effect, in which, for example, one or more additional regions may be disposed adjacent (e.g., below or under) the drift region 92 for further depletion in the device area. Further details regarding the structural and operational characteristics of suitable RESURF regions are set forth in U.S. Pat. No. 6,882,023 ("Floating RESURF LDMOSFET and Method of Manufacturing Same").

The shape, dopant concentration profile, and/or other characteristics of the current path and any portions or regions thereof may vary from the example shown. For example, the dopant concentration profile of the drift region 92 in the lateral dimension shown in FIG. 3 may vary. The dopant concentration levels, profiles, and other characteristics of the drift region 92 may vary as described in U.S. Patent Publication No. 2013/0292764 ("Semiconductor Device with Drain-End Drift Diminution") and co-pending and commonly assigned U.S. patent application Ser. No. 13/748,076, filed Jan. 23, 2013, and entitled "Semiconductor Device with Enhanced RESURF." In some cases, the drift region 92 may include a number of wells or other constituent regions to provide a non-uniform dopant concentration level across the lateral width Ldrift shown in FIG. 3. The dopant concentration profile and/or level of one or more of the other current path regions may alternatively or additionally vary.

As shown in FIG. 3, the halo region 50 is disposed within the body region 68. In this embodiment, the halo region 50 is a p-type region that extends laterally under the gate 18. The halo region 50 extends laterally beyond the extension region 84 to modify a portion of the channel region 86, as described below. In one example, the halo region 50 extends into the channel region 86 to an extent that about 5 percent to about 10 percent of the channel region 86 is doped by the halo implant. The extent to which the halo region 50 extends under the gate 18 (e.g., beyond any source extension region) may vary.

The lateral extent of the implants used to form the halo region 50 and the body region 68 overlap such that the dopant from the halo region implant augments the doping of the body region implant in the halo region 50. Thus, at a given depth below the substrate surface, the halo region 50 has a higher dopant concentration level than the body region 68.

The positioning of the halo region 50 within the body region 68 establishes the non-uniform nature of the channel region 86. The channel region 86 includes a first section in which the dopant concentration level is established by the implants for both the halo region 50 and the body region 68 and a second section in which the dopant concentration level is established by the implant for the body region 68 without the halo region 50. The resulting higher dopant concentration level in the halo region 50 leads to a higher threshold voltage level for the transistor structure 60 relative to a transistor structure with a uniform or non-augmented channel region established by, for instance, the dopant concentration level of the body region 68 alone. As described below in connection with FIG. 4, the other transistor structures of the device 10 (FIG. 1), e.g., the transistor structures 14, 15 (FIG. 1) of the other composite transistor 12 (FIG. 1) may have such non-augmented or uniform channel regions.

The higher threshold voltage of the transistor structure 60 may be used to establish a higher threshold voltage for the constituent transistor device 13 (FIG. 1). The higher threshold voltage may, in turn, decrease the amount of power generated in an interior area of the device 10, thereby improving the thermal SOA of the device 10.

Figure 4:
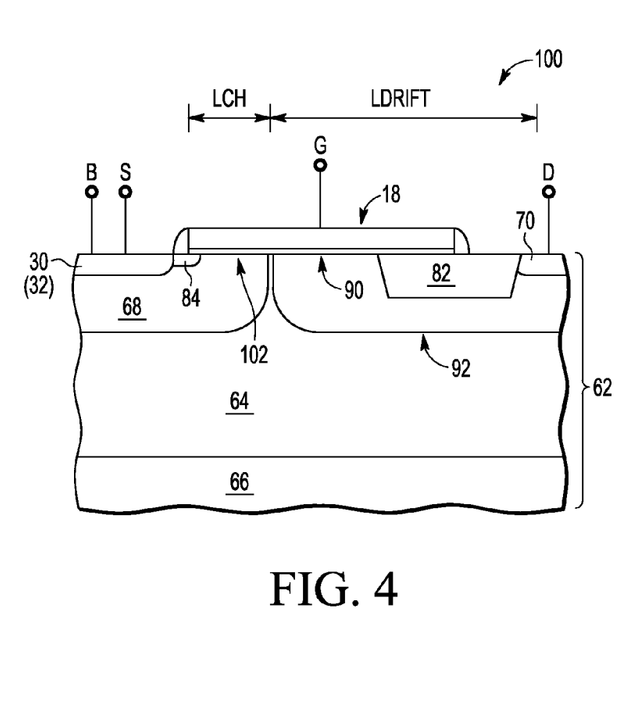
FIG. 4 is a partial, cross-sectional, schematic view of an exemplary transistor structure of another one of the constituent transistor devices of FIGS. 1 and 2 taken along lines 4-4 of FIG. 2 and having a lower threshold voltage in accordance with one embodiment.

FIG. 4 is a schematic, cross-sectional view of an example of a transistor structure 100 of the constituent transistor 12 (FIGS. 1 and 2) taken along lines 4-4 of FIG. 2. The transistor structure 100 may be of one of the transistor structures 14 or one of the transistor structures 15 (FIGS. 1 and 2). The transistor structure 100 may be configured similarly to the transistor structure 60 described above in connection with FIG. 3. Regions, components, and other features in common with the transistor structure 60 are accordingly labeled with like reference numerals. For example, in addition to the shared gate 18, the transistor structure 100 is disposed in semiconductor substrate 62 and/or epitaxial layer 64 thereof, and includes the following similarly configured regions: body region 68, drain region 70, STI region 82, extension region 84, accumulation region 90, and drift region 92. The source region 30 and the body contact region 32 of the transistor structure 100 are also disposed within the body region 68 as described above. With the same body region 68 and the drift region 92, the transistor structure 100 has the same channel length Lch and drift length Ldrift as the transistor structure 60. The transistor structure 100 may thus have the same footprint as the transistor structure 60, thereby allowing the above-described alignment and lack of isolation between the structures 60, 100.

The transistor structure 100 differs from the transistor structure 60 (FIG. 3) in a channel region 102. The channel region 102 lacks a halo region (FIG. 3) within the body region 68. The channel region 102 is uniformly doped as a result of the absence of the dopant associated with a halo implant. The absence of the additional doping (e.g., p-type doping) of the halo implant also leads to a lower threshold voltage for the transistor structure 100 relative to the threshold voltage of the transistor structure 60. The lower threshold voltage may be considered the baseline threshold voltage for the composite device 10 (FIG. 1).

Figure 5:
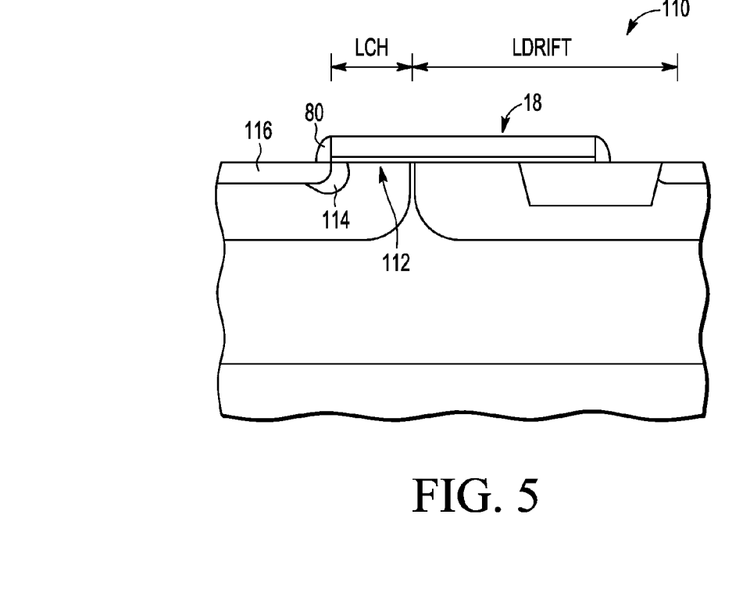
FIG. 5 is a partial, cross-sectional, schematic view of another exemplary constituent LDMOS transistor device with a non-uniform channel and higher threshold voltage in accordance with one embodiment.

FIG. 5 depicts a schematic, cross-sectional view of another example of a transistor structure 110 having a non-uniform channel region 112. The transistor structure 110 may thus be used to form the inner constituent transistor 13 (FIG. 1). The transistor structure 110 may be configured identically or similarly to the transistor structure 60 (FIG. 3) in a number of ways. For example, the transistor structure 110 includes a halo region 114 in the channel region 112 to establish a higher threshold voltage relative to transistor structures of the peripheral constituent transistor 12 (FIG. 1).

The transistor structure 110 differs from the above-described transistor structures in that a source region 116 thereof does not use a source extension region, such as an NLDD region, to connect to the channel region 112. In some embodiments, the source region 116 extends laterally under the sidewall spacers 80 of the gate 18 to reach the channel region 112. Alternatively, the halo region 114 may be formed during a composite implantation procedure, in which an angled implant is used to form the halo region 114 and another, shallow implant of opposite conductivity type is used to establish a connection between the source region 116 and the channel region 112. In an NMOS example, the angled implant is p-type, and the shallow implant is n-type. The shallow implant may result in a dopant concentration level at the surface similar to the exemplary levels provided below for NLDD regions. The shallow implant may have a lower boundary so shallow so as to be non-discernable at the scale of the cross-sectional views of the drawing figures.

The absence of an extension region under the gate 18 may further increase the threshold voltage of the transistor structure 110 relative to the transistor structures of the peripheral transistor 12 (FIG. 1), which may include a source extension region. For example, the addition of a halo region may alone increase the threshold voltage approximately 0.2 Volts (relative to the baseline threshold voltage). In embodiments in which the inner transistor 13 (FIG. 1) combines the halo region with the removal of an NLDD or other extension region, the threshold voltage may increase approximately 0.8 Volts.

The increased threshold voltage of the above-described inner transistors may improve the thermal capacity of the composite transistor device 10 (FIG. 1). The higher threshold voltage decreases the energy generated in the central or inner area of the composite transistor device. In contrast, peripheral areas of the composite transistor device are not affected, but the energy generated in such areas is more easily dissipated. With less energy generated in the interior of the composite transistor device, the onset of thermal breakdown may no longer occur within the interior. In one example, thermal breakdown first occurs just outside the lateral boundary between the constituent transistor devices. The thermal SOA of the composite transistor device improves accordingly.

The improved thermal SOA is achieved without any detrimental effect on other operational parameters of the composite transistor device. For example, neither the breakdown voltage nor the on-resistance (e.g., Rdson) of the transistor structures of the inner constituent transistor 12 (FIG. 1) is adversely affected. The breakdown voltage does not change as a result of the presence of the halo region. Any changes to the on-resistance arising from the halo region are minimal or negligible.

The above-described transistor structures are shown in simplified form. For example, FIGS. 3-5 do not show the conductive (e g, ohmic) contacts and other metal layers configured for electric coupling of the source, drain, and gate regions and terminals. The devices may have a number of other structures or components for connectivity, isolation, passivation, and other purposes not shown in FIGS. 1-5 for ease in illustration. For instance, the devices may include any number of additional metal layers and corresponding passivation layers disposed in between the metal layers. In some examples, another p-type epitaxial layer (not shown) may be disposed between the original substrate and the device area.

The dopant concentrations, thicknesses, and other characteristics of the above-described semiconductor regions in the semiconductor substrate 62 may vary. In one example of the embodiment shown in FIGS. 3-5, the above-referenced semiconductor regions may have the following approximate concentrations and thicknesses:

| | Concentration | Thickness |
| --- | --- | --- |
| sources 30, 46: | $1 \times 10^{21}$-$5 \times 10^{21}$/cm$^3$ | 0.15-0.25 μm |
| body contacts 32, 48: | $1 \times 10^{21}$-$5 \times 10^{21}$/cm$^3$ | 0.15-0.25 μm |
| halo 50, 114: | $1 \times 10^{18}$-$1 \times 10^{19}$/cm$^3$ | 0.15-0.35 μm |

-continued

| | Concentration | Thickness |
|---|---|---|
| p-epi 64: | $1 \times 10^{13}$-$1 \times 10^{15}$/cm$^3$ | 3-10 µm |
| substrate 66: | $1 \times 10^{15}$-$1 \times 10^{18}$/cm$^3$ | not applicable |
| body 68: | $1 \times 10^{16}$-$1 \times 10^{18}$/cm$^3$ | 0.5-1.5 µm |
| drain 70: | $1 \times 10^{21}$-$5 \times 10^{21}$/cm$^3$ | 0.15-0.25 µm |
| NLDD: | $1 \times 10^{18}$-$1 \times 10^{19}$/cm$^3$ | 0.2-0.3 µm |
| drift 92: | $5 \times 10^{15}$-$5 \times 10^{17}$/cm$^3$ | 0.5-2.5 µm |

The concentrations and thicknesses may be different in other embodiments. For example, the dopant concentration of the original substrate 66 may vary considerably.

Figure 6:
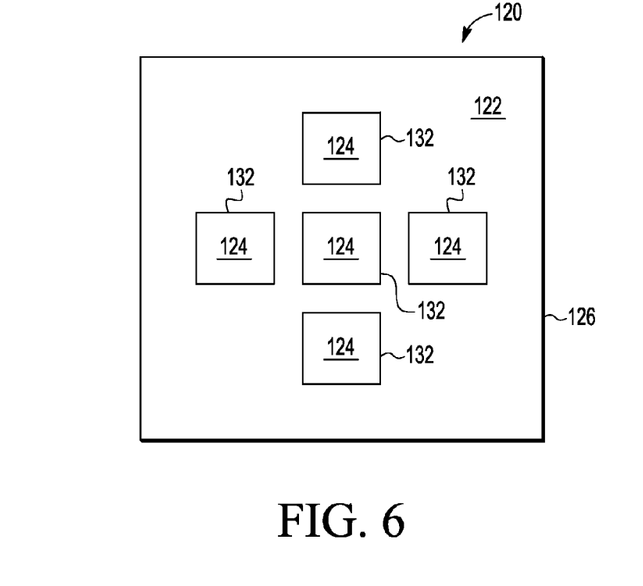
FIG. 6 is a schematic, plan view of another exemplary composite LDMOS transistor device having an arrangement of constituent transistor devices in accordance with one embodiment.

FIG. 6 depicts another exemplary composite transistor device 120 having an arrangement of constituent transistor devices with different threshold voltages. In this example, the composite transistor device 120 includes a primarily peripheral or outer constituent transistor device 122 and multiple inner constituent transistor devices 124. The inner devices 124 are spaced from an outer boundary 126 of the composite transistor device 120, and disposed in areas from which heat is not easily removed. In this embodiment, the inner devices 124 are disposed in a central area 130, as well as four areas 132 disposed outwardly from the central area 130 along two lateral directions. Other arrangements may be used for the inner devices 124. For example, a single, cross-shaped inner device 124 may be used instead of the four inner devices 124 shown in FIG. 6.

Each constituent device 122, 124 may include a plurality of transistor structures as described above. For instance, the transistor structures may be disposed in a periodically repeating source-gate-drain arrangement in which adjacent transistor structures share either a source region or a drain region. Further, the source regions may laterally alternate with body contact regions as described above. The transistor structures of the constituent devices 122, 124 are also not isolated from one another, but rather may be contiguous and aligned with one another in an end-to-end abutting relationship, as described above.

Figure 7:
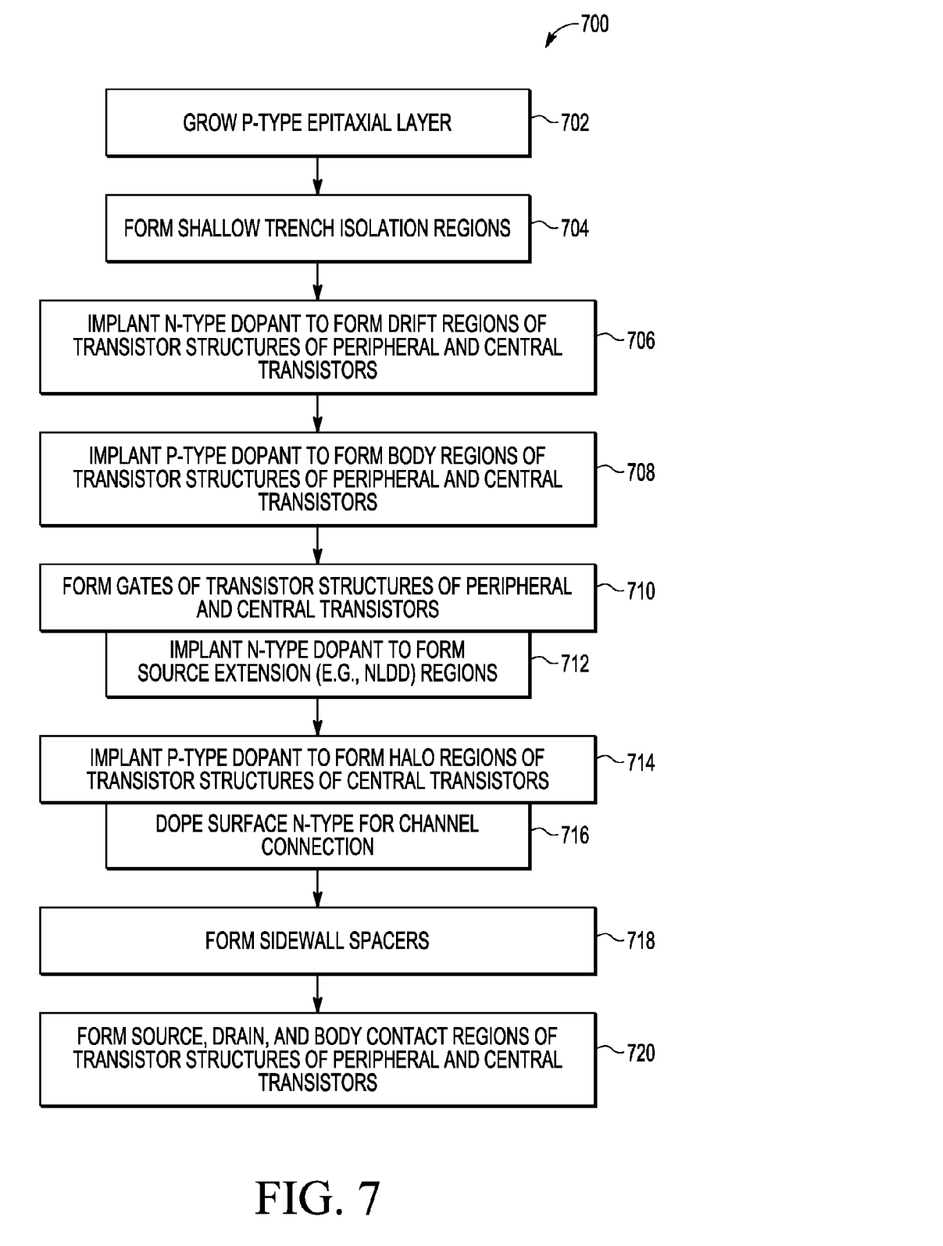
FIG. 7 is a flow diagram of an exemplary fabrication sequence to construct a composite LDMOS transistor device in accordance with one embodiment.

FIG. 7 shows an exemplary fabrication method 700 for fabricating a semiconductor device with an improved thermal SOA as described above. The method may be directed to fabricating a composite transistor device having multiple constituent transistor devices. In the embodiment of FIG. 7, peripheral (or outer) and central (or inner) constituent devices are provided. Each constituent transistor device may be configured as an LDMOS transistor device having one or more of the features described above. For instance, the LDMOS transistor device may include a number of transistor structures configured as reduced surface field (RESURF) transistor structures. The transistor device is fabricated with a semiconductor substrate, the regions or layers of which may have the conductivity types of the n-channel examples described above, or be alternatively configured to support a p-channel device. The method includes a sequence of acts, only the salient of which are depicted for convenience in illustration. The ordering of the acts may vary in other embodiments. For example, body regions may be formed before drift regions, effectively reordering acts 706 and 708. The fabrication method is not limited to any particular doping mechanism, and may include future developed doping techniques.

The method may begin with, or include, act 702 in which a p-type epitaxial layer is grown on a heavily doped p-type semiconductor substrate. The substrate may be an SOI or bulk substrate. The act 702 may include the formation of one or more device isolation layers before the growth of the epitaxial layer. The buried device isolation layer may be formed via, e.g., ion implantation, over the buried insulator layer of the SOI substrate. The buried device isolation layer may extend across an entire device area of the composite transistor device. In some cases, the act 702 includes the growth of multiple p-type epitaxial layers. Any number of epitaxial layers may be grown.

In this embodiment, a number of isolation regions are formed at the surface of the substrate in act 704. The isolation regions may be STI regions. The STI regions may include, for instance, field isolation regions, which define the field drift length of each transistor structure of the constituent transistor devices. The isolation regions may be formed via any now known or hereafter developed procedure. For example, the act 704 may include the formation of a trench and the deposition (e.g., chemical vapor deposition, or CVD) of one or more materials in the trench. In some embodiments, the trench is filled with silicon oxide. Additional or alternative materials may be deposited. In an alternative embodiment, the STI region(s) are formed after the drift region is formed.

Other isolation regions may be formed in the act 704. For example, further STI regions and DTI regions may be formed to define an outer boundary of the composite device. Other types of device isolation regions, such as doped isolation regions, may also be used to isolate the composite transistor device. However, as described above, the constituent transistor devices may not be isolated from one another via such regions. As described above, the transistor structures of the constituent transistor devices may be adjacent or contiguous with one another without any isolation region disposed therebetween. For example, ends of the transistor structures may abut one another. Alternatively or additionally, transistor structures of the constituent transistor devices may also be adjacent to one another along a length thereof. The transistor structure of one constituent device may thus share regions (e.g., a drain region) or components (e.g., a gate) with a transistor structure of the other constituent device.

The substrate is doped in act 706 to form well regions in the epitaxial layer. In the embodiment of FIG. 7, n-type dopant is implanted to form a drift region of each transistor structure of the constituent transistor devices. The implantation procedure may be configured with a mask such that well regions are formed as shown in FIG. 3-5. The dopant concentration profile of each well region may vary as described above.

In act 708, the substrate is doped to form body regions of the transistor structures. In this example, p-type dopant is implanted. The body region and the drift region may be disposed line-on-line or spaced apart from one another by a portion of the epitaxial layer.

The fabrication process may then include one or more procedures collectively shown in act 710 directed to the formation of gates of the transistor structures. The procedures may include the deposition or other formation of gate dielectric layers and gate conductive layers (e.g., polysilicon layers). Additional or alternative procedures may be implemented. The gates may be shared by adjacent transistor structures as described above. In some cases, the act 710 includes the formation of source and/or drain extension or transition regions (e.g., NLDD regions) in an act 712. The extension regions may be formed through implantation of dopant (e.g., n-type dopant) before the formation of sidewall spacers of the gates. The dopant implantation may be conducted as an angled implant and/or otherwise configured to provide that the extension regions laterally extend under the gates.

As described above in connection with FIG. 5, the outer and inner constituent transistor devices may differ from one another with regard to the presence of source extension regions. In such embodiments, the transistor structures of the outer constituent transistor device include a source extension region, while the transistor structures of the inner constituent transistor device do not include a source extension region.

A halo region is formed in the respective body regions of the transistor structures of the inner constituent transistor device in act 714. The halo region is disposed under the gates to modify the channel regions of the transistor structures as described above. In the example of FIG. 7, additional p-type dopant is added to form the halo region, thereby augmenting the p-type doping of the body region. Each transistor structure of the inner constituent transistor device may thus have a non-uniform channel region. The additional doping of the halo region establishes the higher threshold voltage of the inner constituent transistor device.

The formation of the halo region may include an angled implant configured to dispose the additional dopant ions under the gates. A photolithographic opening is used to define the area in which the dopant ions are implanted. The boundary between the inner and outer constituent transistor devices is also thus defined. The positioning of the dopant ions may be alternatively or additionally achieved via annealing, diffusion, or other procedures.

In some embodiments, the formation of the halo region also includes an opposite, shallow doping in act 716 configured to establish a connection between the source region and the channel region. The shallow doping may be useful in embodiments not having an NLDD region region that extends the source region. The doping may include implementing a shallow implant that deposits dopant of the opposite conductivity type primarily at the semiconductor surface.

The acts 714 and 716 may be implemented before the formation of sidewall spacers. In this embodiment, dielectric or other sidewall spacers may then be formed along sidewalls of the dielectric and conductive layers of the gates in act 718. The formation of the halo region may occur before, after or in conjunction with the formation of the source, drain, and body contact regions.

In act 720, source, drain, and body contact regions of the constituent transistor devices are formed. A number of heavy implants may be implemented after formation of the sidewall spacers to align the source regions with the gates. In the embodiments described above, n-type dopant is implanted to form the source and drain regions, while p-type dopant is implanted to form the body contact regions. The source regions and the body contact regions may be disposed in a laterally alternating arrangement as described above.

Additional acts may be implemented at various points during the fabrication procedure. For example, a number of acts may anneal the substrate to reposition the dopant ions in the drift or other regions and to repair the substrate after implantation procedures. Other examples of additional acts include depositing and defining one or more metal and passivation layers supported by the substrate.

The above-described semiconductor devices and electronic apparatus have improved energy capability through the formation of a composite transistor arrangement. The composite devices have an improved thermal SOA as a result of the formation of a central or inner constituent transistor device having a higher threshold voltage than a peripheral or outer constituent transistor device. The higher threshold voltage may delay thermal failure until thermal breakdown occurs in the peripheral device. Thermal breakdown may thus be delayed or avoided in the areas (e.g., inner areas) of the composite device in which heat is difficult to remove. The higher threshold voltage is established through the formation of a halo region in the transistor structures of the inner constituent transistor device. The transistor structures of the constituent transistor devices are not isolated from one another. In some cases, the presence of the halo region is the only difference between the constituent transistor devices. The transistor structures of the constituent transistor devices may thus have the same footprint. The area of the halo region may thus define the boundary between the constituent transistor devices. These aspects of the composite device may allow the improvements in thermal SOA to be achieved without any significant detrimental effects on the breakdown voltage level and/or on-resistance of the composite device. An overall increase in device area may thus be avoided.

In a first aspect, a device includes a semiconductor substrate, a first constituent transistor including a first plurality of transistor structures in the semiconductor substrate connected in parallel with one another, and a second constituent transistor including a second plurality of transistor structures in the semiconductor substrate connected in parallel with one another. The first and second constituent transistors are disposed laterally adjacent to one another and connected in parallel with one another. Each transistor structure of the first plurality of transistor structures includes a non-uniform channel such that the first constituent transistor has a higher threshold voltage level than the second constituent transistor.

In a second aspect, a device includes a semiconductor substrate, a first constituent transistor including a first plurality of transistor structures in the semiconductor substrate connected in parallel with one another, and a second constituent transistor laterally contiguous with the first transistor, including a second plurality of transistor structures in the semiconductor substrate connected in parallel with one another. Each transistor structure of the first and second plurality of transistor structures includes a body region disposed in the semiconductor substrate and having a first conductivity type, source and drain regions disposed in the semiconductor substrate and having a second conductivity type, the source region being disposed within the body region, and a gate supported by the semiconductor substrate and to which a bias voltage is applied during operation to form a channel in the body region to support current flow between the source and drain regions. Each transistor structure of the first plurality of transistor structures further includes a halo region disposed in the semiconductor substrate, having the first conductivity type, and extending into the channel from the source region such that the first constituent transistor has a higher threshold voltage than the second constituent transistor.

In a third aspect, a method of fabricating a device in a semiconductor substrate. The method includes forming body regions in the semiconductor substrate of first and second pluralities of transistor structures of first and second transistors, respectively, the first and second transistors being adjacent to one another, the body regions having a first conductivity type, forming gates of the first and second pluralities of transistor structures over the semiconductor substrate, forming source and drain regions in the semiconductor substrate of the first and second pluralities of transistor structures, the source and drain regions having a second conductivity type, and implanting dopant of the first conductivity type in the semiconductor substrate in the body region under the gates in the first plurality of transistor structures such that the first transistor has a higher threshold voltage level than the second transistor.

Semiconductor devices with a conductive gate electrode positioned over a dielectric or other insulator may be considered MOS devices, despite the lack of a metal gate electrode and an oxide gate insulator. Accordingly, the terms metal-oxide-semiconductor and the abbreviation "MOS" may be used even though such devices may not employ metals or oxides but various combinations of conductive materials, e.g., metals, alloys, silicides, doped semiconductors, etc., instead of simple metals, and insulating materials other than oxides (e.g., nitrides, oxy-nitride mixtures, etc.). Thus, as used herein, the terms MOS and LDMOS are intended to include such variations.

Embodiments of the present invention are defined by the following claims and their equivalents, and nothing in this section should be taken as a limitation on those claims. Further aspects and advantages of the invention are discussed above in conjunction with the preferred embodiments and may be later claimed independently or in combination.

While the disclosure has described various embodiments, it should be understood that many changes and modifications may be made without departing from the scope of the disclosure. It is therefore intended that the foregoing detailed description be regarded as illustrative rather than limiting, and that it be understood that it is the following claims, including all equivalents, that are intended to define the spirit and scope of this disclosure.

The invention claimed is:

1. A device comprising:
a semiconductor substrate;
a first constituent transistor comprising a first plurality of transistor structures in the semiconductor substrate connected in parallel with one another; and
a second constituent transistor comprising a second plurality of transistor structures in the semiconductor substrate connected in parallel with one another;
wherein the first and second constituent transistors are disposed laterally adjacent to one another and connected in parallel with one another;
wherein each transistor structure of the first plurality of transistor structures comprises a non-uniform channel such that the first constituent transistor has a higher threshold voltage level than the second constituent transistor; and
wherein the first and second constituent transistors are arranged as inner and outer devices, respectively.

2. The device of claim 1, wherein each transistor structure of the first plurality of transistor structures comprises:
a body region disposed in the semiconductor substrate, having a first conductivity type, and in which the non-uniform channel is formed during operation; and
a halo region disposed within the body region, having the first conductivity type, and having a higher dopant concentration level than the body region.

3. The device of claim 1, wherein the first plurality of transistor structures are laterally surrounded by the second plurality of transistor structures.

4. The device of claim 1, wherein the first plurality of transistor structures are centered within the second plurality of transistor structures.

5. The device of claim 1, wherein the first and second pluralities of transistor structures are not electrically isolated from one another.

6. The device of claim 1, wherein:
each transistor structure of the second plurality of transistor structures comprises a source extension region in the semiconductor substrate; and
each transistor structure of the first plurality of transistor structures does not comprise a source extension region in the semiconductor substrate.

7. The device of claim 1, wherein the first and second constituent transistors are laterally diffused metal-oxide-semiconductor (LDMOS) transistors.

8. The device of claim 1, wherein a respective transistor structure of the first plurality of transistor structures is aligned with a respective transistor structure of the second plurality of transistor structures such that the respective transistor structures share a common gate supported by the semiconductor substrate.

9. A device comprising:
a semiconductor substrate;
a first constituent transistor comprising a first plurality of transistor structures in the semiconductor substrate connected in parallel with one another; and
a second constituent transistor comprising a second plurality of transistor structures in the semiconductor substrate connected in parallel with one another;
wherein the first and second constituent transistors are disposed laterally adjacent to one another and connected in parallel with one another;
wherein each transistor structure of the first plurality of transistor structures comprises a non-uniform channel such that the first constituent transistor has a higher threshold voltage level than the second constituent transistor; and
wherein:
each transistor structure of the first and second pluralities of transistor structures comprises a source region disposed within the body region;
each body region comprises a plurality of body contact regions; and
the source region comprises a plurality of constituent source regions disposed in a laterally alternating arrangement with the plurality of body contact regions.

10. The device of claim 9, wherein a lateral boundary between adjacent transistor structures of the first constituent transistor and the second constituent transistor is disposed in one of the plurality of body contact regions.

11. A device comprising:
a semiconductor substrate;
a first constituent transistor comprising a first plurality of transistor structures in the semiconductor substrate connected in parallel with one another; and
a second constituent transistor comprising a second plurality of transistor structures in the semiconductor substrate connected in parallel with one another;
wherein the first and second constituent transistors are disposed laterally adjacent to one another and connected in parallel with one another;
wherein each transistor structure of the first plurality of transistor structures comprises a non-uniform channel such that the first constituent transistor has a higher threshold voltage level than the second constituent transistor; and
wherein:
each transistor structure of the first and second pluralities of transistor structures comprises a body region in which a channel is formed during operation;
the channel of each transistor structure of the first and second pluralities of transistor structures is oriented in a first lateral direction; and
the first and second constituent transistors are laterally contiguous with one another in a second lateral direction orthogonal to the first lateral direction.

12. A device comprising:
a semiconductor substrate;
a first constituent transistor comprising a first plurality of transistor structures in the semiconductor substrate connected in parallel with one another; and a second constituent transistor laterally contiguous with the first constituent transistor, comprising a second plurality of transistor structures in the semiconductor substrate connected in parallel with one another;

wherein each transistor structure of the first and second plurality of transistor structures comprises:
- a body region disposed in the semiconductor substrate and having a first conductivity type;
- source and drain regions disposed in the semiconductor substrate and having a second conductivity type, the source region being disposed within the body region; and
- a gate supported by the semiconductor substrate and to which a bias voltage is applied during operation to form a channel in the body region to support current flow between the source and drain regions;

wherein each transistor structure of the first plurality of transistor structures further comprises a halo region disposed in the semiconductor substrate, having the first conductivity type, and extending into the channel from the source region such that the first constituent transistor has a higher threshold voltage than the second constituent transistor; and wherein the first and second constituent transistors are arranged as inner and outer devices, respectively.

13. The device of claim 12, wherein each transistor structure of the second plurality of transistor structures lacks a halo region.

14. The device of claim 12, wherein the first plurality of transistor structures are laterally surrounded by the second plurality of transistor structures.

15. The device of claim 12, wherein the first and second pluralities of transistor structures are not electrically isolated from one another.

16. The device of claim 12, wherein:
- each body region comprises a plurality of body contact regions; and
- the source region comprises a plurality of constituent source regions disposed in a laterally alternating arrangement with the plurality of body contact regions.

17. The device of claim 16, wherein:
- the halo region has a lateral boundary that defines adjacent transistor structures of the first constituent transistor and the second constituent transistor; and
- the lateral boundary is disposed in one of the plurality of body contact regions.

18. A method of fabricating a device in a semiconductor substrate, the method comprising:

forming body regions in the semiconductor substrate of first and second pluralities of transistor structures of first and second constituent transistors, respectively, the first and second constituent transistors being adjacent to one another, the body regions having a first conductivity type;

forming gates of the first and second pluralities of transistor structures over the semiconductor substrate;

forming source and drain regions in the semiconductor substrate of the first and second pluralities of transistor structures, the source and drain regions having a second conductivity type; and implanting dopant of the first conductivity type in the semiconductor substrate in the body regions under the gates in the first plurality of transistor structures such that the first constituent transistor has a higher threshold voltage level than the second constituent transistor;

wherein the first and second constituent transistors are arranged as inner and outer devices, respectively.

19. The method of claim 18, further comprising implanting dopant of the second conductivity type to form source extension regions of the second plurality of transistor structures.

20. A method of fabricating a device in a semiconductor substrate, the method comprising:

forming body regions in the semiconductor substrate of first and second pluralities of transistor structures of first and second constituent transistors, respectively the first and second constituent transistors being adjacent to one another, the body regions having a first conductivity type;

forming gates of the first and second pluralities of transistor structures over the semiconductor substrate;

forming source and drain regions in the semiconductor substrate of the first and second pluralities of transistor structures, the source and drain regions having a second conductivity type; and implanting dopant of the first conductivity type in the semiconductor substrate in the body regions under the gates in the first plurality of transistor structures such that the first constituent transistor has a higher threshold voltage level than the second constituent transistor;

wherein implanting the dopant of the first conductivity type comprises performing a halo implant configured to form a halo region of a logic transistor in the semiconductor substrate.

* * * * *